(12) United States Patent
Kim

(10) Patent No.: US 7,001,129 B2
(45) Date of Patent: Feb. 21, 2006

(54) LOADLOCK APPARATUS AND STRUCTURE FOR CREATING A SEAL BETWEEN AN ELEVATOR DRIVE SHAFT AND THE LOADLOCK CHAMBER THEREOF

(75) Inventor: Ho Kim, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 171 days.

(21) Appl. No.: 10/300,020

(22) Filed: Nov. 20, 2002

(65) Prior Publication Data
US 2003/0230854 A1    Dec. 18, 2003

(30) Foreign Application Priority Data
Jun. 18, 2002    (KR) ................................ 2002-33920

(51) Int. Cl.
*B65G 49/07*    (2006.01)
(52) U.S. Cl. .................... 414/217; 414/217.1; 414/939
(58) Field of Classification Search ................ 414/217, 414/217.1, 939
See application file for complete search history.

(56) References Cited

U.S. PATENT DOCUMENTS 4,724,621 A * 2/1988 Hobson et al. ............... 34/218
5,224,999 A * 7/1993 Shiraiwa et al. ............ 118/724
6,311,983 B1   11/2001 Burcham

FOREIGN PATENT DOCUMENTS

| DE | 4210110 | * | 3/1992 |
| JP | 11354615 | * | 12/1999 |
| WO | 01/20663 | * | 3/2001 |

* cited by examiner

Primary Examiner—Janice L. Krizek
(74) Attorney, Agent, or Firm—Volentine Francos & Whitt, PLLC

(57) ABSTRACT

Sealing structure for use in creating a seal between an elevator drive shaft and a loadlock chamber includes a base fastened over a hole in the bottom wall of the loadlock chamber, a fixed member fastened to an upper part of the base, a seal housing spaced above the fixed member, a cap in the form of a flexible bellows having a first end adhered to an upper surface of the fixed member and a second end adhered to a lower surface of the seal housing, one or more support shafts having upper and lower ends pivotally connected to the seal housing and the fixed member outside the cap, a seal seated in the seal housing and having an inner circumferential surface contacting the outer circumferential surface of the elevator drive shaft, and a seal cover fixed to an upper part of the seal housing. According to the present invention, uniform pressure is maintained between the shaft and the seal during assembly and operation of the apparatus. Thus, a seal is always maintained between the elevator drive shaft and the bottom wall of the loadlock chamber.

11 Claims, 4 Drawing Sheets

LOADLOCK APPARATUS AND STRUCTURE FOR CREATING A SEAL BETWEEN AN ELEVATOR DRIVE SHAFT AND THE LOADLOCK CHAMBER THEREOF

BACKGROUND OF THE INVENTION

1. Field of the Invention

The present invention relates to a loadlock apparatus having a loadlock chamber and an elevator extending into the loadlock chamber. More particularly, the present invention relates to sealing structure that creates a seal between a drive shaft of the elevator and the loadlock chamber into which the drive shaft extends.

2. Description of the Related Art

In general, in the fabricating of a semiconductor device, a wafer is passed through a loadlock chamber before being introduced into a process chamber in which the wafer is processed in a vacuum. Such a loadlock chamber receives the non-processed wafer from the outside under atmospheric pressure. The wafer is then loaded from the loadlock camber into the process chamber under the same vacuum atmosphere as the process chamber. The processed wafer is returned to the loadlock chamber and is then transferred from there for subsequent processing.

FIG. 1 shows such loadlock chamber 10, and an elevator 20 provided for use in transferring wafers to and from the loadlock chamber 10. The elevator 20 is configured to store numerous wafers and to raise and lower these wafers within the loadlock chamber 10. More specifically, the elevator 20 includes a wafer cassette 21, and an elevator drive shaft 22 connected to a lower portion of the cassette 21. The cassette may have 29 slots for accommodating 29 wafers, respectively. The elevator 20 also includes a specific driving unit (not shown in the drawings) for moving the elevator drive shaft 22 axially over a stroke which enables the cassette to, in turn, move between a position at which slot number 1 of the cassette is located at a loading/unloading position and a position at which slot number 29 of the cassette is located at the loading/unloading position.

Meanwhile, maintaining the air-tightness of the loadlock chamber 10 is extremely important because the loadlock chamber 10 is temporarily placed in open communication with the process chamber when a wafer is transferred therebetween. In particular, the most difficult portion of the loadlock chamber 10 to keep sealed is that portion where the elevator drive shaft 22 extends through the bottom of the loadlock chamber 10. Specifically, as the elevator shaft 22 is raised, air from the outside may flow into the loadlock chamber 10 along with that portion of the elevator drive shaft 22 entering the loadlock chamber 10. At present, this portion of the loadlock apparatus is provided with a dynamic seal to prevent such an inflow of air, i.e., in an attempt to maintain the air-tightness of the loadlock chamber 10 during the operation of the elevator 20.

FIG. 2 shows a prior art dynamic sealing structure 30 for providing a seal with an elevator drive shaft 22 at the bottom of a loadlock chamber. The sealing structure 30 is largely constructed of a base 31, a fixed cap 32, an elevator guide 33, a mounting member 34, a seal 35 and a seal cover 36. The base 31 covers and is fastened along the circumference of a hole in a bottom wall of the loadlock chamber. The elevator guide 33 is made of Teflon® and is disposed on an upper part of the base 31 at the center of the base 31. The mounting member 34 is made of metal and is integrated with the elevator guide 33 at an outer circumferential portion of the elevator guide 33. The fixed cap 32, whose interior is open in a downward direction, covers an upper part of the mounting member 34 and is secured to the base 31 by bolts to thereby secure the elevator guide 33 to the base 31.

Furthermore, the seal 35 is disposed on an upper end of the elevator guide 33. The seal 35 is covered with the seal cover 36. A lower end part of the seal cover 36 is interposed between the elevator guide 33 and the inner circumferential portion of the fixed cap 32, whereby the seal cover 36 is held in place. On the other hand, an outer circumferential part of the seal cover 36 is disposed on an upper portion of the fixed cap 32. This outer circumferential part of the seal cover 36 is fastened together with the fixed cap 32 to the mounting member 34 by bolts. This assembly thus constitutes a solid structural combination and yet allows for the necessary movement between respective components.

However, a leak check executed after the sealing structure 30 and the elevator shaft 22 are assembled and are integrated with the loadlock chamber 10 often reveals a leak. The leak is attributed to the tolerances which allow the fixed cap 32 to be bolted to the base 31 with some degree of flexibility, and to the fact that the elevator drive shaft 22 is not always inserted into the loadlock chamber 10 uniformly (see FIGS. 3 and 4). Furthermore, when the elevator drive shaft 22 is driven in this state, the friction between the seal 35 and the elevator drive shaft 22 causes unequal wear in the seal 35, whereby the useful life of the seal 35 is shortened (FIG. 4).

SUMMARY OF THE INVENTION

Therefore, an object of the present invention is to provide sealing structure that is capable of always maintaining a seal between an elevator drive shaft and a loadlock chamber regardless of the position of the elevator shaft.

Another object of the present invention is to provide sealing structure that is capable of maintaining a uniform contact force between a seal of the structure and an elevator drive shaft, thereby prolonging the useful life of the seal, and the time between servicing the sealing structure.

To achieve these objects, the sealing structure for use in creating a seal between the bottom wall of a loadlock chamber and the drive shaft of an elevator that extends into the loadlock chamber comprises a fixture disposed over the hole in the bottom wall of the loadlock chamber, and an upper part supported above and pivotally connected to the fixture so as to be movable laterally with respect to the fixture.

The fixture has an outer circumferential part fastened to the bottom wall of the loadlock chamber, and a shaft-receiving hole through which the elevator drive shaft extends. On the other hand, the upper part of the sealing structure includes a seal housing having a shaft-receiving opening through which the elevator drive shaft extends, and an annular seal seated in the seal housing. The annular seal has an inner circumferential surface contacting the outer circumferential surface of the elevator drive shaft.

A cap in the form of a flexible bellows extends around the elevator drive shaft between an upper part of the fixture and a lower part of the seal housing. The cap is preferably made of a synthetic resin.

At least one support shaft is disposed generally coaxially with respect to the cap and at the outside of the cap. Each support shaft has upper and lower ends that are pivotally connected to the upper part of the sealing structure and to the fixture, respectively. The support shaft(s) supports the upper part of the sealing structure such that the upper part, including the seal, is movable laterally with respect to the fixture, to accommodate for deviations of the elevator drive shaft from its ideal set position.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, preferred embodiments of the present invention will be described in detail with reference to FIGS. 5–7.

Figure 1:
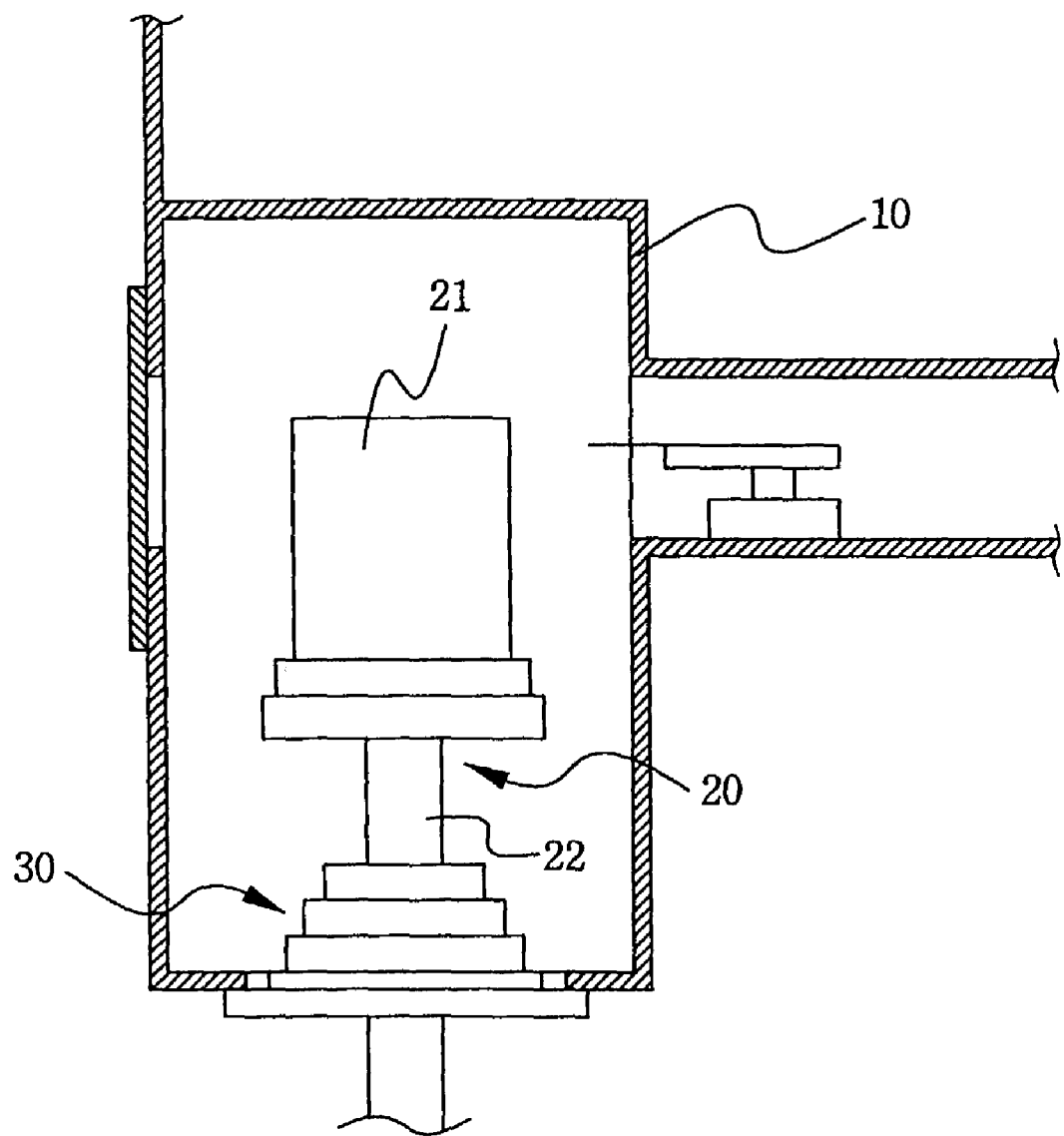
FIG. 1 is a side view, partially in section, of a conventional loadlock apparatus.
Figure 2:
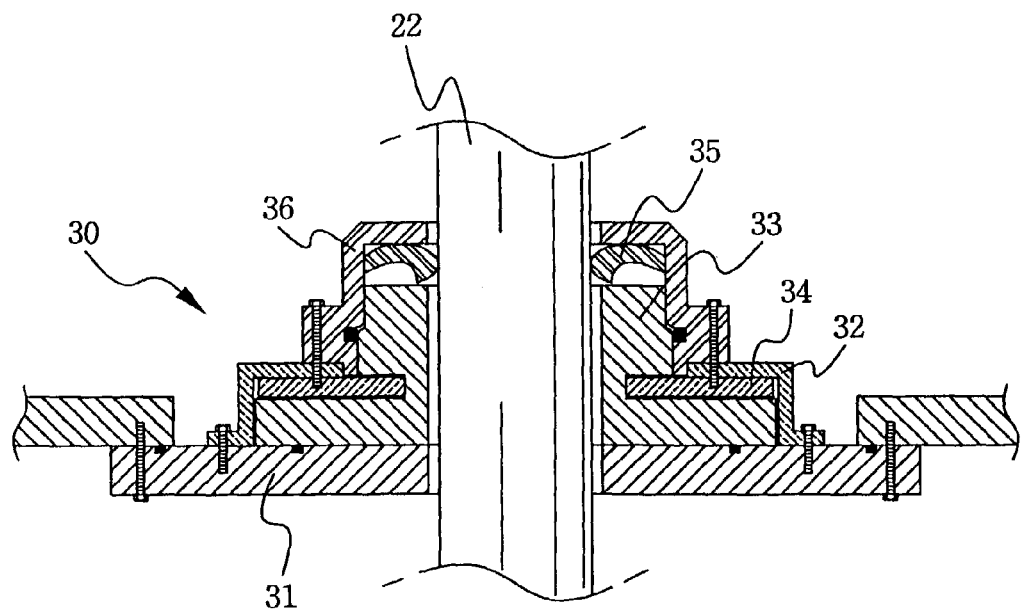
FIG. 2 is a sectional view of prior art sealing structure in the conventional loadlock apparatus.
Figure 3:
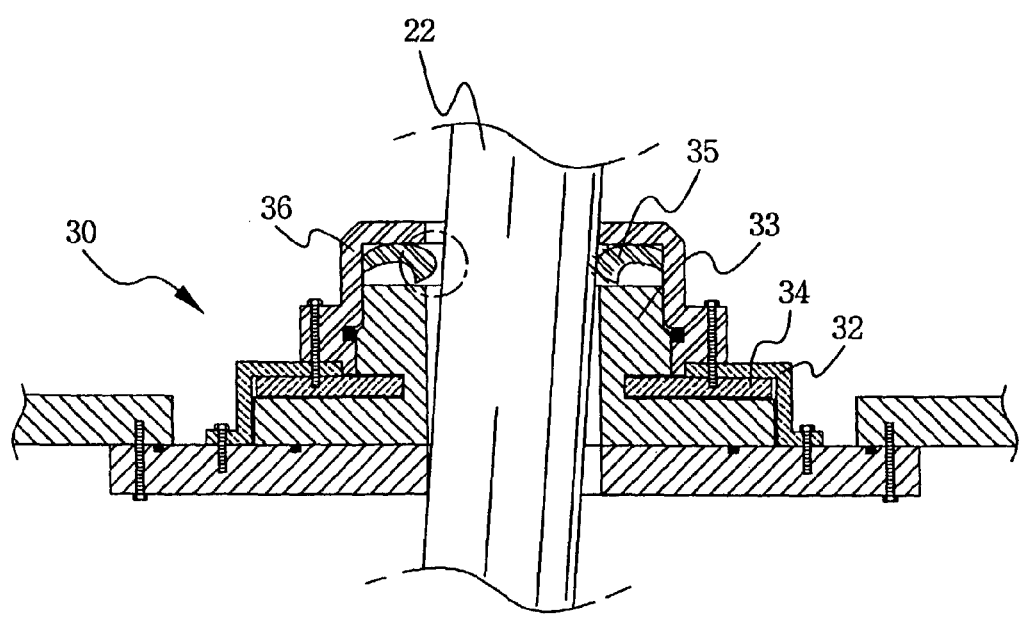
FIGS. 3 and 4 are each a sectional view of the prior art sealing structure showing its relation with elevator drive shafts that are not properly inserted into the loadlock chamber.
Figure 4:
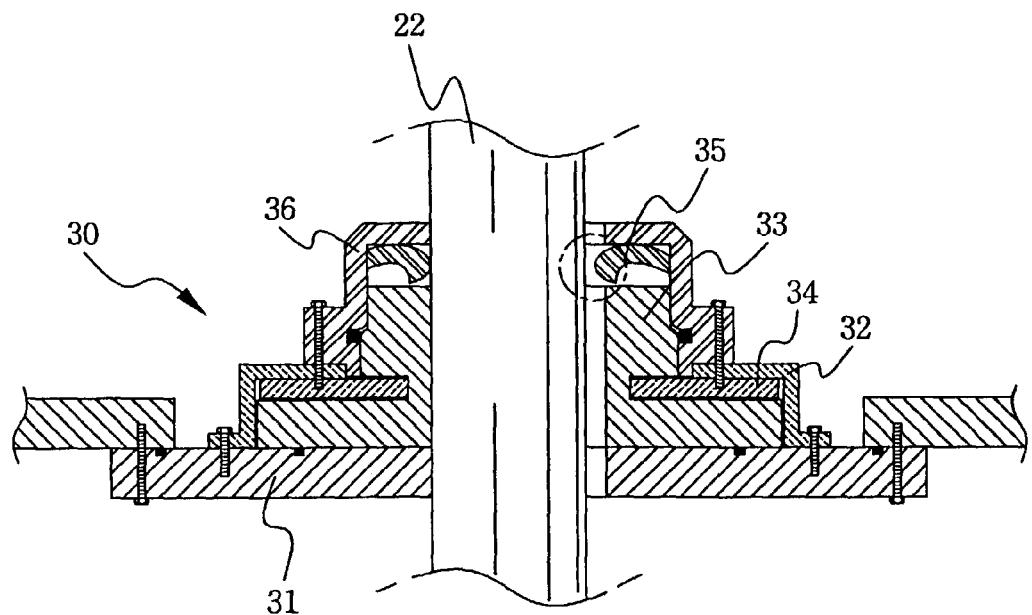
Figure 5:
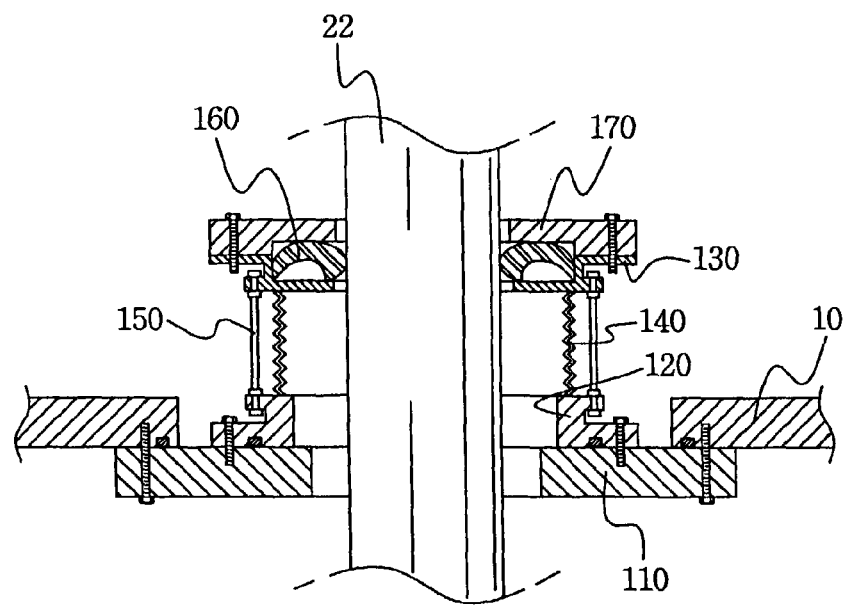
FIG. 5 is a sectional view of sealing structure in accordance with the present invention.

Referring first to FIG. 5, reference numeral 10 designates a loadlock chamber and reference numeral 22 designates an elevator drive shaft.

As was previously discussed, the loadlock chamber 10 is generally vacant, and is connected to a process chamber to allow wafers received from the outside to be loaded into the process chamber under the same atmosphere as prevails in the process chamber. Likewise, the loadlock chamber receives processed wafers from the process chamber and allows the processed wafers to be transferred to the outside without exposing the interior of the process chamber to the outside atmosphere. In other words, the loadlock chamber 10 forms an airtight space that connects the outside and the process chamber.

An elevator is used to facilitate the transfer of a batch of wafers in the manner described above. The elevator includes an elevator drive shaft 22 and a cassette (previously shown and described in connection with the prior art) connected to the upper end of the elevator drive shaft 22. A sealing structure provides a seal at the bottom of the loadlock chamber 10 where the elevator drive shaft 22 enters the loadlock chamber 10.

The sealing structure includes a base 110, a fixed member 120, a seal housing 130, a cap 140, at least one support shaft 150, a seal 160 and a seal cover 170.

The base 110 covers and is bolted along the circumference of a hole in a bottom wall of the loadlock chamber 10. An O-ring is interposed between the base 110 and the bottom wall of the loadlock chamber 10, so as to ensure that a seal is maintained between the base 110 and the bottom wall of the loadlock chamber.

The fixed member 120 is bolted to an upper part of the base 110 within the loadlock chamber 10. In addition, the fixed member 120 is fastened and extends alongside a shaft-receiving hole formed in the center of the base 110. The fixed member 120, in turn, has a shaft-receiving hole extending through the center thereof and whose diameter is larger than the shaft-receiving hole in the base 110. Preferably, an O-ring is provided between the fixed member 120 and the base 110.

The base 110, fixed member 120 and optional O-ring together constitute a fixture of the sealing structure.

The seal housing 130 is spaced a certain distance above the fixed member 120. The seal housing 130 has an axial shaft-receiving hole extending vertically therethrough and whose diameter is greater than the diameter of the elevator drive shaft 22. The seal housing 130 defines a recess at an inner portion thereof and which recess is open in an upward direction.

The cap 140 is in the form of a bellows that shields the elevator drive shaft 22. To this end, the bottom of the cap 140 is adhered to the fixed member 120, whereas the top of the cap 140 is adhered to the bottom of the seal housing 130. The cap 140 is also made of a flexible material by which it can extend and contract upwards and downwards and by which the upper end of the cap 140 can move side-to-side, along with seal housing 130, relative to its lower end. The cap 140 is made of a synthetic resin, for example, and shields the portion of the elevator drive shaft located therewithin.

A support shaft 150 is provided outwardly of the cap 140 to support and maintain the seal housing 130 a uniform height above the fixed member 120. Upper and lower ends of the support shaft 150 are pivotally connected to the seal housing 130 and the fixed member 120, respectively. In such a vertically oriented structure, the support shaft 150 is free to become inclined due to side-to-side movement of the upper part of the cap 140; however, the pivotal connections of the support shaft preferably limit the inclination of the support shaft 150 to 5~10° maximum relative to the vertical. Two support shafts 150 may be provided diametrically across from each other with respect to the shaft-receiving holes of the sealing structure, and more than two support shafts 150 may be used as necessary or desired. In the latter case, the three or more supports shafts are also disposed symmetrically.

The seal 160 is the same type of dynamic annular sealing member used in the prior art. In the present invention, the annular seal 160 is seated in the recess defined by the seal housing 130, and the inner diameter of the seal 160 is slightly smaller than the diameter of the elevator shaft 22. Accordingly, the seal 160 uniformly contacts the outer circumferential surface of the elevator drive shaft 22 so as to provide a seal with the elevator drive shaft 22.

The seal cover 170 covers the seal 160. The outer circumferential part of the seal cover 170 is strongly fastened to an upper part of the seal housing 130. Thus, the seal 160 is seated in the seal housing 130 and is covered by the seal cover 170 so as to be fixed in place. Furthermore, the seal 160 can be easily exchanged by dismantling only the seal cover 170.

As is clear form the description above, the sealing structure according to the present invention can be characterized as having an upper part—constituted by the seal 160, seal housing 130 and seal cover 170—that is free to move in a horizontal direction. The sealing structure according to the present invention functions as follows.

When the sealing structure is assembled with the loadlock chamber 10, and the elevator drive shaft 22 is inserted therethrough, the elevator drive shaft 22 may not be exactly centered relative to the loadlock chamber 10 or the base 110 and/or may be inclined slightly relative to the vertical.

Figure 6:
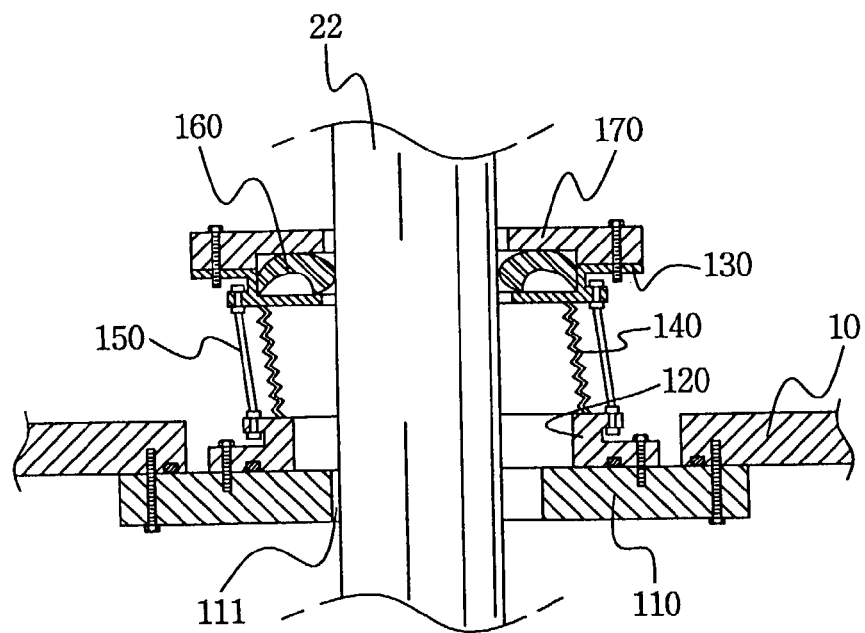
FIGS. 6 and 7 are each a sectional view of the sealing structure according to the present invention, showing its relation with elevator drive shafts that are extending incorrectly into the loadlock chamber.

In other words, as shown in FIG. 6, the elevator drive shaft 22 may be disposed eccentrically with respect to the shaft-receiving hole 111 in the center of the base 110 and the shaft-receiving hole in the center of the fixed member 120. Nonetheless, the seal housing 130, seal 160 and seal cover 170 constituting the upper part of the sealing structure are moved horizontally by an amount corresponding to the aforementioned eccentricity of the elevator drive shaft 22. Such movement of the seal housing 130, seal 160 and seal cover 170 is possible because, again, the upper parts of the cap 140 and the support shaft 150 can move laterally relative to the respective lower parts thereof.

The uniform contact between the seal 160 and the elevator drive shaft 22 is maintained as the upper part of the sealing structure is moved horizontally due to its being interlocked with the elevator shaft 22. Accordingly, a uniform and stable seal remains between the seal 160 and the elevator drive shaft 22.

Figure 7:
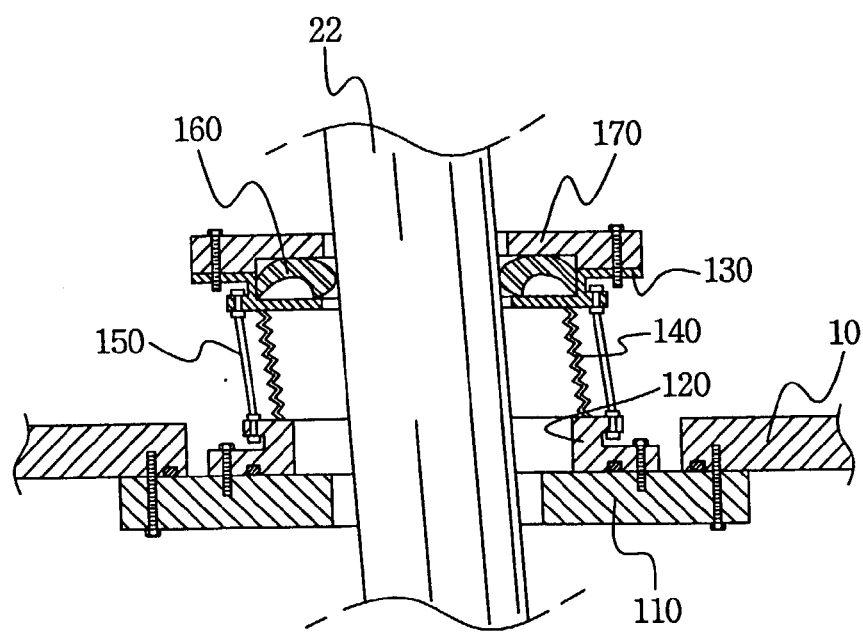

On the other hand, if the elevator shaft 22 is inserted into the loadlock chamber in an inclined state as shown in FIG. 7, only an upper portion of the elevator drive shaft may be disposed eccentrically with respect to the shaft-receiving hole 111 in the center of the base 110 and the shaft-receiving hole in the center of the fixed member 120. Of course, in this case as well, the seal 160 moves horizontally with the upper portion of the elevator drive shaft 22. Accordingly, a uniform face-to-face contact between the seal and the elevator shaft 22 is maintained.

As described above, in accordance with the present invention, if the elevator drive shaft 22 is inserted incorrectly into the load lock chamber 10 or even if the elevator drive shaft 22 becomes eccentric during operation, the seal 160 adhering to the elevator drive shaft 22, the seal housing 130 in which the seal 160 is seated, and the seal cover 170 move along with any lateral movement of the elevator drive shaft 22. Hence, a uniform seal is always maintained with the elevator drive shaft 22.

Accordingly, the useful life of the seal 160 is prolonged. As a result, the seal 160 does not have to be replaced as frequently. Therefore, the present invention reduces the time and materials costs associated with maintaining the sealing structure.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

What is claimed is:

1. Sealing structure for use in creating a seal with an axially movable drive shaft, said structure comprising:
   a fixture having a shaft-receiving hole extending axially therethrough;
   a seal housing spaced from said fixture, said seal housing having a shaft-receiving opening therethrough, and a recessed portion defined around the shaft-receiving opening;
   a cap in the form of a bellows, and having a first end fixed to an upper part of said fixture and a second end fixed to a lower part of said seal housing, said cap being flexible so as to be extendable and contractable between said fixture and said seal housing;
   at least one support shaft disposed generally coaxially with respect to said cap, having upper and lower ends that are pivotally attached to said seal housing and said fixture, respectively, so that the at least one support shaft can pivot relative to both said seal housing and said fixture, wherein said least one support shaft supports said seal housing such that said seal housing is movable laterally with respect to said fixture;
   an annular seal seated in the recessed portion of said seal housing; and
   a seal cover fastened to said seal housing over said recessed portion thereof.

2. The sealing structure of claim 1, wherein said fixture comprises a base in the form of a flat plate, a fixed member fastened to said base, and an O-ring interposed between said base and said fixed member as extending around said shaft-receiving hole in said fixture.

3. The sealing structure of claim 1, wherein said recessed portion of the seal housing is open at the top of said seal housing.

4. The sealing structure of claim 1, wherein said cap is made of a synthetic resin.

5. The sealing structure of claim 1, wherein the pivotal attachments of said at least one support shaft to said seal housing and to said fixture allow said support shaft to tilt by 5~10° maximum from a vertical orientation.

6. The sealing structure of claim 1, wherein said at least one support shaft comprises at least two support shafts disposed symmetrically about the shaft-receiving opening in said fixture.

7. The sealing structure of claim 1, wherein said annular seal is a dynamic wiper seal.

8. Loadlock apparatus comprising:
   a loadlock chamber having a bottom wall in which an opening is defined;
   an elevator including an elevator drive shaft extending into said loadlock chamber through the opening in said bottom wall thereof; and
   sealing structure that creates a seal between the bottom wall of said loadlock chamber and the drive shaft of said elevator, said sealing structure comprising
   a fixture disposed over the opening in the bottom wall of said loadlock chamber, said fixture having an outer circumferential part fastened to the bottom wall of said loadlock chamber, and a shaft-receiving hole through which said elevator drive shaft extends, and
   an upper part supported above and pivotally connected to said fixture so as to be movable laterally with respect to said fixture, said elevator drive shaft extending through and being unattached to the upper part of the sealing structure so as to be vertically movable relative to the upper part of the sealing structure, and the upper part of said sealing structure including
   a seal housing having a shaft-receiving opening through which said elevator drive shaft extends, and a recessed portion defined around the shaft-receiving opening, and
   an annular dynamic wiper seal seated in the recessed portion of said seal housing, said annular dynamic wiper seal having an inner circumferential surface disposed in sliding contact with the outer circumferential surface of said elevator drive shaft so that said seal remains in contact with the elevator drive shaft as the shaft moves vertically relative to the upper part of the seal housing;
   wherein said sealing structure includes a cap in the form of a bellows extending around said elevator drive shaft, said cap having a first end fixed to an upper part of said fixture and a second end fixed to a lower part of said seal housing, said cap being flexible so as to be extendable and contractable between said fixture and said seal housing; and
   wherein said sealing structure includes at least one support shaft disposed generally coaxially with respect to said cap, having upper and lower ends that are pivotally attached to the upper part of said sealing structure and to said fixture, respectively, and supporting the upper part of said sealing structure such that said upper part is movable laterally with respect to said fixture.

9. The apparatus of claim 8, wherein said at least one support shaft comprises at least two support shafts disposed symmetrically about the shaft-receiving opening in said fixture.

10. Loadlock apparatus comprising:
a loadlock chamber having a bottom wall in which an opening is defined;
an elevator including an elevator drive shaft extending into said loadlock chamber through the opening in said bottom wall thereof; and
sealing structure that creates a seal between the bottom wall of said loadlock chamber and the drive shaft of said elevator, said sealing structure comprising
a fixture disposed over the opening in the bottom wall of said loadlock chamber, said fixture having an outer circumferential part fastened to the bottom wall of said loadlock chamber, and a shaft-receiving hole through which said elevator drive shaft extends, and
an upper part supported above and pivotally connected to said fixture so as to be movable laterally with respect to said fixture, said elevator drive shaft extending through and being unattached to the upper part of the sealing structure so as to be vertically movable relative to the upper part of the sealing structure, and the upper part of said sealing structure including
a seal housing having a shaft-receiving opening through which said elevator drive shaft extends, and a recessed portion defined around the shaft-receiving opening, and
an annular dynamic wiper seal seated in the recessed portion of said seal housing, said annular dynamic wiper seal having an inner circumferential surface disposed in sliding contact with the outer circumferential surface of said elevator drive shaft so that said seal remains in contact with the elevator drive shaft as the shaft moves vertically relative to the upper part of the seal housing;
wherein said sealing structure includes at least one support shaft having upper and lower ends that are pivotally attached to the upper part of said sealing structure and to said fixture, respectively, and supporting the upper part of said sealing structure such that said upper part is movable laterally with respect to said fixture.

11. The apparatus of claim 10, wherein said at least one support shaft comprises at least two support shafts disposed symmetrically about the shaft-receiving opening in said fixture.

\* \* \* \* \*